(12) United States Patent
Lin et al.

(10) Patent No.: US 8,692,273 B2
(45) Date of Patent: *Apr. 8, 2014

(54) LIGHT-EMITTING DEVICE

(75) Inventors: Jin-Ywan Lin, Hsinchu (TW); Ya-Lang Yang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 19 days.

This patent is subject to a terminal disclaimer.

(21) Appl. No.: 13/429,852

(22) Filed: Mar. 26, 2012

(65) Prior Publication Data

US 2012/0181563 A1    Jul. 19, 2012

Related U.S. Application Data

(63) Continuation of application No. 12/620,305, filed on Nov. 17, 2009, now Pat. No. 8,143,636.

(30) Foreign Application Priority Data

Nov. 18, 2008    (TW) ................................ 97144620 A

(51) Int. Cl.
*H01L 33/00* (2010.01)
(52) U.S. Cl.
USPC ................... 257/98; 257/81; 257/79; 257/99; 257/100; 257/103

(58) Field of Classification Search
USPC .......................... 257/98, 81, 79, 99, 100, 103
See application file for complete search history.

(56) References Cited

U.S. PATENT DOCUMENTS

| | | | |
|---|---|---|---|
| 8,143,636 B2 * | 3/2012 | Lin et al. .......................... | 257/98 |
| 2009/0065794 A1 * | 3/2009 | Yu et al. .......................... | 257/98 |
| 2009/0152583 A1 | 6/2009 | Chen et al. | |

FOREIGN PATENT DOCUMENTS

| | | |
|---|---|---|
| TW | 200834969 | 8/2008 |
| TW | 200840088 | 10/2008 |

* cited by examiner

*Primary Examiner* — Tan N Tran
(74) *Attorney, Agent, or Firm* — Muncy, Geissler, Olds & Lowe, P.C.

(57) ABSTRACT

The present application is to provide a light-emitting device comprising a metal reflective layer; a first transparent conductive oxide layer having a first refractive index; a second transparent conductive oxide layer having a second refractive index different from the first refractive index, and being between the metal reflective layer and the first transparent conductive oxide layer; and a light-emitting stack layer electrically connected to the second transparent conductive oxide layer substantially through the first transparent conductive layer; wherein there is no light absorbing material between the metal reflective layer and the first transparent conductive oxide layer.

19 Claims, 2 Drawing Sheets

LIGHT-EMITTING DEVICE

REFERENCE TO RELATED APPLICATION

This application is a continuation of U.S. patent application Ser. No. 12/620,305, entitled "LIGHT-EMITTING DEVICE", filed on Nov. 17, 2009, now U.S. Pat. No. 8,143,636, which claims the right of priority based on TW application Ser. No. 097144620, filed on Nov. 18, 2008, entitled "LIGHT-EMITTING DEVICE" and the contents of which are incorporated herein by reference in its entirety.

TECHNICAL FIELD

The present application relates to a light-emitting device, more particularly to a light-emitting device comprising a dielectric barrier layer disposed between a first transparent conductive oxide layer and a second transparent conductive oxide layer.

BACKGROUND

The light-emitting mechanism of the LED is to release energy generated from the energy gap between an n type semiconductor layer and a p type semiconductor layer by emitting photons thereafter. Because the above mechanism is different from the lighting mechanism of the light bulb, the light-emitting device is named cold light source. Moreover, LED also shows significant improvement in liability, lifetime, flexible application and power saving. Therefore, LED is a long-excepted innovation in the light source industry and considered as one of the preferred lighting device for the next generation.

FIG. 1 is a structure diagram of a conventional light-emitting diode. As shown in FIG. 1, a conventional light-emitting device 100 comprises a conductive substrate 10, a metal adhesive layer 12 disposed on the conductive substrate 10, an omni-directional reflector layer 14 disposed on the metal adhesive layer 12, an ohmic contact layer 15 disposed on the omni-directional reflector layer 14, a light-emitting stack layer 16 disposed on the ohmic contact layer 15, and an electrode 18 disposed on the light-emitting stack layer 16 wherein the ohmic contact layer 15 can be a transparent conductive material such as a transparent conductive oxide layer or a thin metal.

In the conventional light-emitting device 100, the light-emitting stack 16, from top to bottom, comprises a first conductive semiconductor layer 160, a light-emitting layer 162 and a second conductive semiconductor layer 164. The omni-directional reflector layer 14 further comprises a metal reflective layer 140 and a low refractive index layer 142 having lower refractive index comparing with metal reflective layer 140, wherein the material of the metal refractive layer 14 can be Au and Silver, and the material of the low refractive index layer 142 can be SiO2 and Indium Tin Oxide (ITO). In addition, the omni-directional reflector layer 14 further comprises a plurality of ohmic contact dots 144 penetrating through the low refractive index layer 142, and electrically connecting with the ohmic contact layer 15 and the metal refractive layer 140 respectively to conduct current flow so that the electrical performance of the conventional light-emitting device 100 is improved.

However, during the manufacturing process of the above light-emitting diode 100, high thermal processing would incur reaction between the ohmic contact layer 15 and the low refractive index layer 142 of the omni-directional reflector layer 14, and therefore decrease brightness efficiency of the light emitting diode 100. Moreover, the ohmic metal contact point 144, disposed for increasing electrical conductive characteristic of the light-emitting diode 100, is likely to absorb lights emitted from the light emitting layer 162 so as to decrease the lighting efficiency of the light-emitting diode 100.

Besides, the light-emitting device 100 can be combined with other elements to form a light-emitting apparatus. FIG. 4 is a diagram of a conventional light-emitting apparatus. As shown in FIG. 4, a light-emitting apparatus 600 comprises a sub-mount 60 having at least a circuit 602, one solder 62 and an electrical connecting structure 64. The solder 62 is disposed on the sub-mount 60 so as to bond the light-emitting device 100 to the sub-mount 60 and electrically connect the substrate 10 of the light-emitting device 100 with the circuit 602. The electrical connecting structure 64 electrically connects the electrode 18 of the light emitting diode 100 with the circuit 602 of the sub-mount 60 wherein the sub-mount 60 can be a lead frame or a mounting substrate for the purpose of circuit arrangement and heat dissipation.

SUMMARY

The present application is to provide a light-emitting device comprising a metal reflective layer; a first transparent conductive oxide layer having a first refractive index; a second transparent conductive oxide layer having a second refractive index different from the first refractive index, and being between the metal reflective layer and the first transparent conductive oxide layer; and a light-emitting stack layer electrically connected to the second transparent conductive oxide layer substantially through the first transparent conductive layer; wherein there is no light absorbing material between the metal reflective layer and the first transparent conductive oxide layer.

Other features and advantages of the present application and variations thereof will become apparent from the following description, drawing and claims.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The accompanying drawings incorporated herein provide a further understanding of the invention therefore constitute a part of this specification. The drawings illustrating embodiments of the invention, together with the description, serve to explain the principles of the invention.

Figure 1:
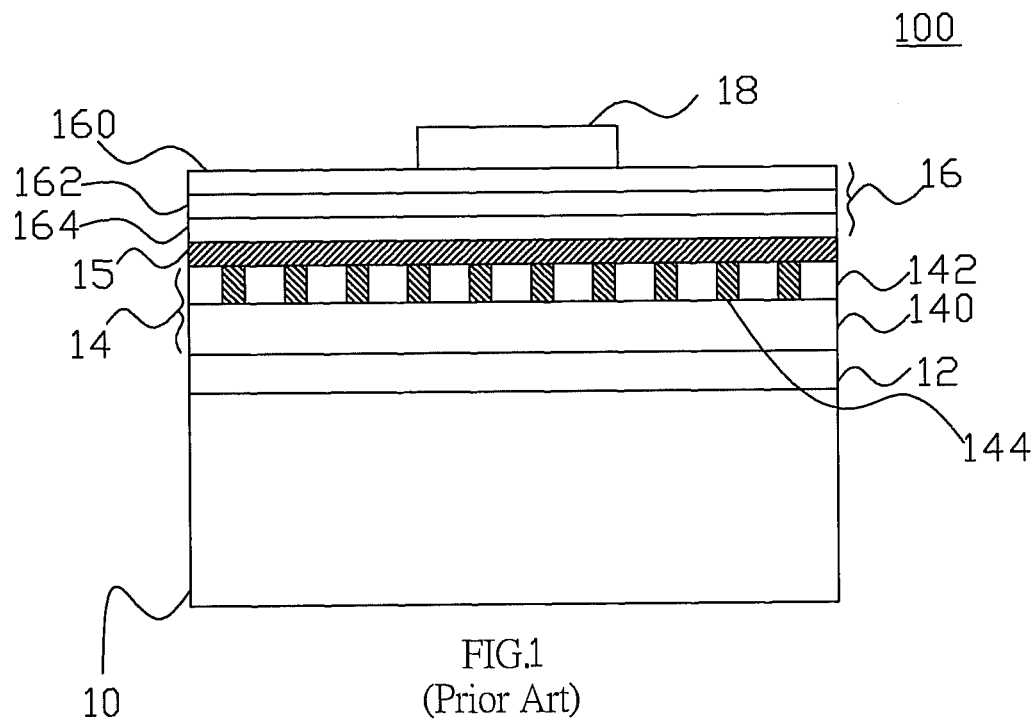
FIG. 1 is a structure diagram illustrating a conventional light-emitting diode.
Figure 2:
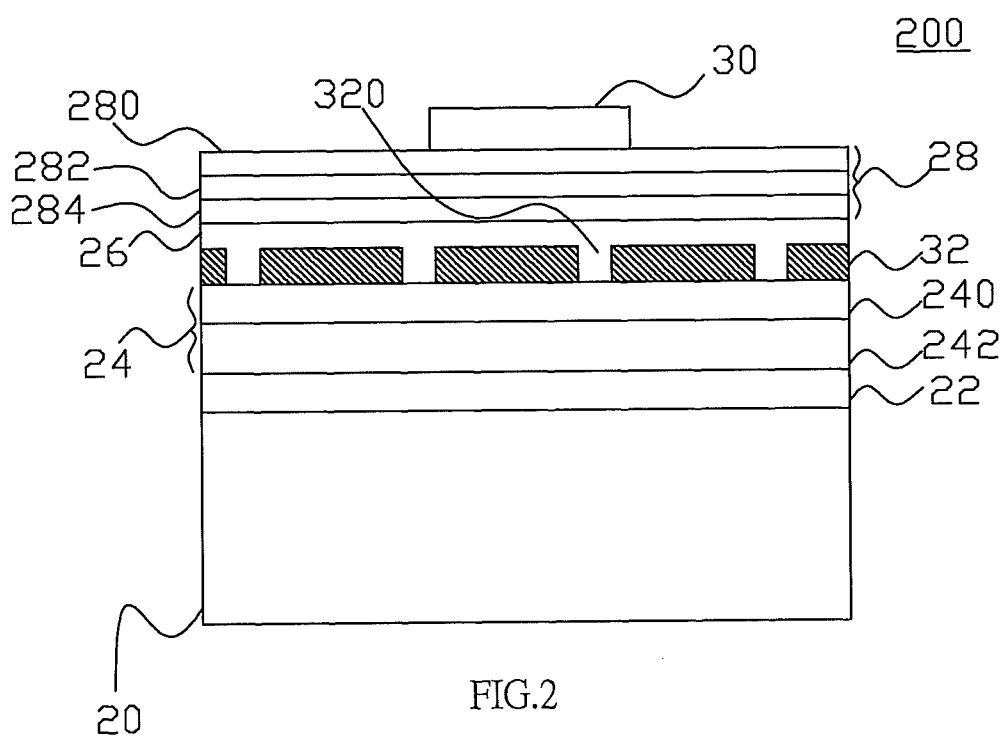
FIG. 2 is a structure diagram in accordance with one embodiment of the present application.

FIG. 2 is a structure diagram in accordance with one embodiment of the present application. As shown in FIG. 2, a light-emitting device 200 comprises a conductive substrate 20, an adhesive layer 22 disposed on the conductive substrate 20, an omni-directional reflector (ODR) 24 disposed on the adhesive layer 22, a first transparent conductive oxide layer 26 disposed on the omni-directional reflector 24, a light-emitting stack layer 28 disposed on the first transparent conductive oxide layer 26, and an electrode 30 disposed on the light emitting stack layer 28, wherein a transparent dielectric barrier layer 32 is further disposed between the omni-directional reflector 24 and the first transparent conductive oxide layer 26, and the omni-directional reflector layer 24, from top to bottom, further comprises a second transparent conductive oxide layer 240 and a metal reflective layer 242. In addition, the light emitting stack layer 28 comprises a first conductive semiconductor layer 280, a light-emitting layer 282 and a second conductive semiconductor layer 284, wherein the above light-emitting stack layer 28 can be III-V semiconductor materials comprising elements selected from the group consisting of Al, Ga, In, P, As, or N, such as GaN, AlGaInP, or GaAs. The structure of the light emitting layer 282 can be single heterostructure (SH), double heterostructure (DH), double-side double heterostructure (DDH), or multi-quantum well (MQW).

In this embodiment, the material of the conductive substrate 20 can be semiconductor material such as silicon, ceramic material such as ZnO, or metal material such as copper, aluminum or molybdenum, or combinations thereof. Materials of the adhesive layer 22 can be Indium, Tin, Au, Al, Silver and combinations thereof. The materials of the first transparent conductive oxide layer 26 and the second transparent conductive oxide layer 240 can be Indium Tin Oxide (ITO), Aluminum Zinc Oxide (AZO), SnCdO, Antimony Tin Oxide (ATO), ZnO or ZnSnO (ZTO), wherein the grain size and the reflective index of the first transparent conductive oxide layer 26 is different from those of the second transparent conductive oxide layer 240. In this embodiment, the average grain size of the first transparent conductive oxide layer 26 is larger than the average grain size of the second transparent conductive oxide layer 240, and the refractive index of the first transparent conductive oxide layer 26 is smaller than that of the second transparent conductive oxide layer 240. In addition, the material of the metal reflective layer 242 can be high refractive index materials such as In、Sn、Al、Au、Pt、Zn、Ag、Ti、Pb、Ge、Cu、Ni、AuBe、AuGe、AuZn, or PbSn. The material of the transparent dielectric barrier layer 32 can be SiO2、SiNx or Al$_2$O$_3$. The thickness of the transparent dielectric barrier layer 32 is about 5 nm to 300 nm.

Moreover, in this embodiment, for achieving good electrical conduction, the transparent dielectric barrier layer 32 further comprises a through region, comprising one or more than one through holes 320, wherein the first transparent conductive oxide layer 26 fills the through hole 320 and electrically connects with the second transparent conductive oxide layer 240. In this embodiment, the area of the through region is less than 40 percent of the area of the transparent dielectric barrier layer 32, and the area of the through hole 320 less than 5 percent of the area of the transparent dielectric barrier layer 32 is preferred.

In this embodiment, because the first transparent conductive oxide layer 26 is also an ohmic contact layer forming ohmic contact with light-emitting stack layer 28, and the first transparent conductive oxide layer 26 is electrically connected with the second transparent conductive oxide layer 240, it is not necessary to contain light-absorbing material to improve the electrical performance, and the possibility of the absorption of light emitted from the light emitting layer 282 is also reduced. Moreover, the transparent dielectric barrier layer 32 is disposed between the first transparent conductive oxide layer 26 and the second transparent conductive oxide layer 240 disposed on the omni-directional reflector layer 24 so as to prevent reaction between the first transparent conductive oxide layer 26 and the second transparent conductive oxide layer 240 at the high thermal environment during manufacturing process. Therefore, the brightness of the light emitting device 200 is raised.

Figure 3:
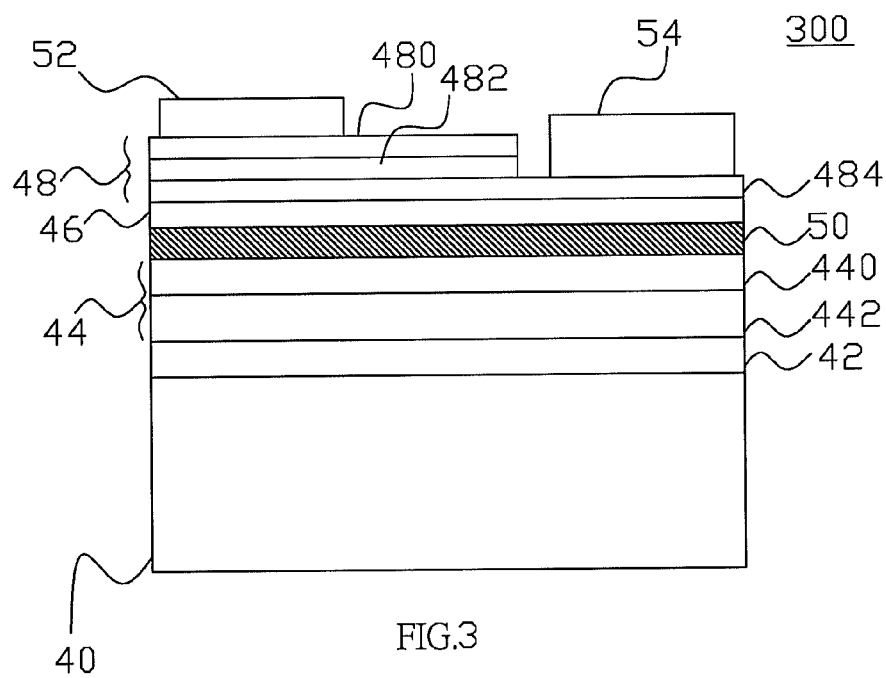
FIG. 3 is a structure diagram in accordance with another embodiment of the present application.
Figure 4:
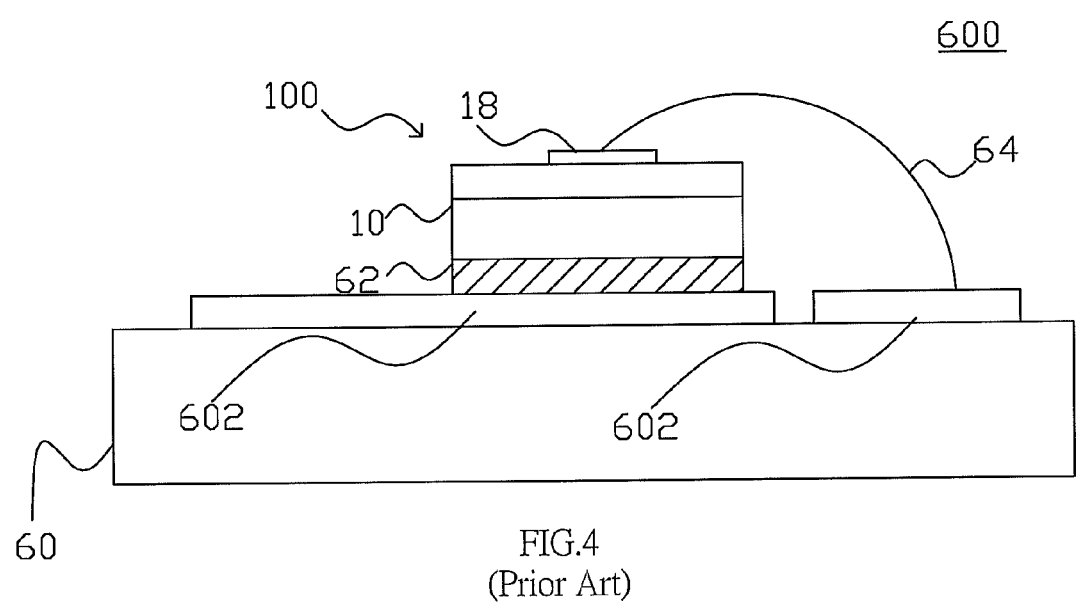
FIG. 4 is a diagram illustrating a conventional light-emitting apparatus.

FIG. 3 is a structure diagram in accordance with another embodiment of the present application. As shown in FIG. 3, the light-emitting device 300 comprises a substrate 40, an adhesive layer 42 disposed on the substrate 40, an omni-directional reflector (ODR) 44 disposed on the adhesive layer 42, a first transparent conductive oxide layer 46 disposed on the omni-directional reflector (ODR) 44, and a light emitting stack layer 48 disposed on the first transparent conductive oxide layer 46, wherein a transparent dielectric barrier layer 50 is further disposed between the omni-directional reflector 44 and the first transparent conductive oxide layer 46, and the omni-directional reflector 44, from top to bottom, further comprises a second transparent conductive oxide layer 440 and a metal reflective layer 442.

In addition, from top to bottom, the light emitting stack layer 48 comprises a first conductive semiconductor layer 480, a light emitting layer 482 and a second conductive semiconductor layer 484. The light emitting stack layer 48 has a surface exposing the second conductive semiconductor layer 484. A first electrode 52 and a second electrode 54 are disposed on the first conductive semiconductor 480 and the surface exposing the second conductive semiconductor layer 484 respectively. The light emitting stack layer 48 can be elements selected from the group consisting of III-V semiconductor materials comprising Al, Ga, In, P, As, or N, and combination thereof, such as GaN, AlGaInP, or GaAs. The structure of the light emitting layer 282 can be heterostructure (SH), doubleheterostructure (DH), double-side double heterostructure (DDH), or multi-quantum well (MQW).

In this embodiment, the material of the substrate 40 can be semiconductor material such as silicon or GaAs, ceramic material such as AlN or Al$_2$O$_3$, or metal material such as copper, aluminum or molybdenum, and combination thereof Materials of the adhesive layer 42 can be Indium, Tin, Au, Al, Silver, alloys thereof, PI, BCB, or PFCB. The material of the first transparent conductive oxide layer 46 and the second transparent conductive oxide layer 440 can be Indium Tin Oxide (ITO), Aluminum Zinc Oxide (AZO), SnCdO, Antimony Tin Oxide (ATO), ZnO or Zn$_2$SnO$_4$ (ZTO), wherein characteristics such as the grain size and reflective index of the first transparent conductive oxide layer 46 are different from the grain size and reflective index of the second transparent conductive oxide layer 440. In this embodiment, the average grain size of the first transparent conductive oxide layer 46 is larger than the average grain size of the second transparent conductive oxide layer 440, and the refractive index of the first transparent conductive oxide layer 46 is smaller than the refractive index of the second transparent conductive oxide layer 440. In addition, the material of the metal refractive layer 442 can be high refractive index materials such as In、Sn、Al、Au、Pt、Zn、Ag、Ti、Pb、Ge、Cu、Ni、AuBe、AuGe、AuZn, or PbSn. The materials of the transparent dielectric barrier layer 50 can be SiO2、SiNx or Al$_2$O$_3$, and the thickness of the transparent dielectric barrier layer 50 is substantially between 5 nm to 300 nm.

In this embodiment, because the transparent dielectric barrier layer 50 is disposed between the first transparent conductive oxide layer 46 and the omni-directional reflector 44, the reaction between the first transparent conductive oxide layer 46 and the second transparent conductive oxide layer 440 at the high thermal environment during manufacturing process is avoided. Therefore, the brightness of the light emitting device 300 is raised.

Other embodiments of the application will be apparent to those having ordinary skills in the art from consideration of the specification and practice of the invention disclosed herein. It is intended that the specification and examples be considered as exemplary only, with a true scope and spirit of the invention being indicated by the following claims.

We claim:

1. A light-emitting device, comprising:
   a metal reflective layer;
   a first transparent conductive oxide layer having a first refractive index;
   a second transparent conductive oxide layer having a second refractive index different from the first refractive index, and being between the metal reflective layer and the first transparent conductive oxide layer; and
   a light-emitting stack layer electrically connected to the second transparent conductive oxide layer substantially through the first transparent conductive layer;
   wherein there is no light absorbing material between the metal reflective layer and the first transparent conductive oxide layer, and
   wherein the first transparent conductive oxide layer has an average grain size larger than that of the second transparent conductive oxide layer.

2. The light-emitting device of claim 1, further comprising:
   a substrate; and
   an adhesive layer between the substrate and the metal reflective layer.

3. The light-emitting device of claim 1, wherein the first refractive index is smaller than the second refractive index.

4. The light-emitting device of the claim 1, wherein at least one of the first transparent conductive oxide layer and the second transparent conductive oxide layer comprises a material selected from the group consisting of indium, tin, aluminum, stannum (Sn), cadmium (Cd), antimony, and zinc.

5. The light-emitting device of claim 1, wherein at least one of first transparent conductive oxide layer and the second transparent conductive oxide layer comprises a material selected from the group consisting of ITO, AZO, SnCdO, ATO, ZnO, and ZTO.

6. The light-emitting device of claim 1, wherein the first transparent conductive oxide layer is in direct contact with the second transparent conductive oxide layer.

7. The light-emitting device of claim 1, wherein the first transparent conductive oxide layer and the second transparent conductive oxide layer substantially have the same width.

8. A light-emitting device, comprising:
   a metal reflective layer;
   a first transparent conductive oxide layer having a first average grain size;
   a second transparent conductive oxide layer having a second average grain size different from the first average grain size, and being between the metal reflective layer and the first transparent conductive oxide layer; and
   a light-emitting stack layer electrically connected to the second transparent conductive oxide layer substantially through the first transparent conductive layer;
   wherein there is no light absorbing material between the metal reflective layer and the first transparent conductive oxide layer.

9. The light-emitting device of claim 8, further comprising:
   a substrate; and
   an adhesive layer between the substrate and the metal reflective layer.

10. The light-emitting device of claim 8, wherein the first average grain size is larger than the second average grain size.

11. The light-emitting device of claim 8, wherein the first transparent conductive oxide layer has a refractive index different from that of the second transparent conductive oxide layer.

12. The light-emitting device of claim 8, wherein at least one of the first transparent conductive oxide layer and the second transparent conductive oxide layer comprises a material selected from the group consisting of indium, tin, aluminum, stannum (Sn), cadmium (Cd), antimony, and zinc.

13. The light-emitting device of claim 8, wherein at least one of first transparent conductive oxide layer and the second transparent conductive oxide layer comprises a material selected from the group consisting of ITO, AZO, SnCdO, ATO, ZnO, or ZTO.

14. The light-emitting device of claim 8, wherein the first transparent conductive oxide layer is in direct contact with the second transparent conductive oxide layer.

15. The light-emitting device of claim 8, wherein the first transparent conductive oxide layer and the second transparent conductive oxide layer substantially have the same width.

16. A light-emitting device, comprising:
   a light-emitting stack layer;
   a first transparent conductive oxide layer having a first refractive index;
   a second transparent conductive oxide layer having a second refractive index different from the first refractive index, and electrically connected to the light-emitting stack layer substantially through the first transparent conductive layer; and
   a transparent dielectric barrier layer between the light-emitting stack layer and the second transparent conductive oxide layer.

17. The light-emitting device of claim 16, further comprising:
   a substrate; and
   an adhesive layer between the substrate and the light-emitting stack layer.

18. The light-emitting device of claim 16, wherein the transparent dielectric barrier layer is narrower than the second transparent conductive oxide layer.

19. The light-emitting device of claim 16, further comprising an electrode just above the transparent dielectric barrier layer.

* * * * *